THERMOELECTRIC REFRIGERATOR

Filed April 22, 1963

Inventors:
Andrew P. Boehmer and
Boubene M. Jaremus
By: James J. Jennings, Jr. Atty.

United States Patent Office 3,195,315

Patented July 20, 1965

3,195,315
THERMOELECTRIC REFRIGERATOR

Andrew P. Boehmer and Boubene M. Jaremus, Barrington, Ill., assignors to Borg-Warner Corporation, Chicago, Ill., a corporation of Illinois Filed Apr. 22, 1963, Ser. No. 275,188
2 Claims. (Cl. 62—3)

The present invention is directed to a thermoelectric refrigerator with a freezer compartment, and more particularly to such a refrigerator in which only a very small lateral dimension is available to mount the thermoelectric modules.

With the advent of increasingly efficient thermoelectric cooling apparatus, compact and efficient refrigerators in which thermoelectric units provide the requisite cooling have become commercially available. In compact refrigerators where total volume is most important only a relatively small spacing is provided between the inner and outer panel surfaces of the refrigerator between which insulation is retained to retard heat loss through the panels. With this small lateral dimension between the inner and outer panel surfaces of each wall, there is only a very small space remaining in which to mount the thermoelectric source of cooling energy. In addition, the insertion of the thermoelectric modules is further complicated by the mechanical problems posed in supporting the cooling load, such as a tray filled with water to be frozen into ice cubes, while at the same time conducting heat away from the water and through the thermoelectric unit, to the atmosphere adjacent the compact refrigerator.

It is, therefore, a primary object of the present invention to provide a compact thermoelectric refrigerator with a minimum lateral dimension between the exterior of the refrigerator box and the interior or refrigerator compartment, and still provide an adequate mounting for the thermoelectric unit.

It is a more specific object of the invention to provide such a refrigerator in which a secure mechanical support arrangement is provided in conjunction with the mounting of the thermoelectric modules.

The foregoing and other objects of the invention are realized, in one embodiment, by mounting the thermoelectric modules so that the module assembly is parallel the inner and outer panel surfaces in one wall of the thermoelectric refrigerator. The inner panel is apertured to define an opening, and such opening is sized to receive an upstanding leg of an L-shaped supporting-and-heat-conducting member. The vertical leg of the L-shaped member defines an opening for receiving fastening means. A thermoelectric assembly is provided, which assembly also includes a central apertured portion. This assembly is disposed substantially parallel to the inner and outer panel surfaces, flush with the vertical leg of the L-shaped member. A heat-conducting assembly includes a first apertured portion abutting the thermoelectric assembly, and extending between such assembly and the outer panel, and a second portion which includes a plurality of fin elements extending outwardly of the outer panel to dissipate heat to the atmosphere. Fastening means extends through the first apertured portion of the heat-conducting assembly, through the central apertured portion of the thermoelectric assembly and into the opening of the vertical leg of the L-shaped member. Foamed-in-place insulation is also disposed between the inner and outer panels, abutting the vertical leg of the L-shaped member, the thermoelectric assembly and the first portion of the heat-conducting assembly. Integrally joined to the upstanding leg of the L-shaped member is a horizontally extending support ledge which is positioned within the freezer compartment and provides a firm and secure mechanical support for receiving the ice cube tray or other freezing load. In accordance with the inventive teaching, the member fulfills a dual function, not only providing a secure mechanical support but also defining an efficient heat-conducting path for removing heat from the load to effect the requisite cooling thereof.

In order to acquaint those skilled in the art with the best mode contemplated for making and using the invention, a preferred embodiment thereof will be described in connection with the accompanying drawing, in which several figures of which like reference numerals identify like elements, and in which.

Figures 1, 2, 3:
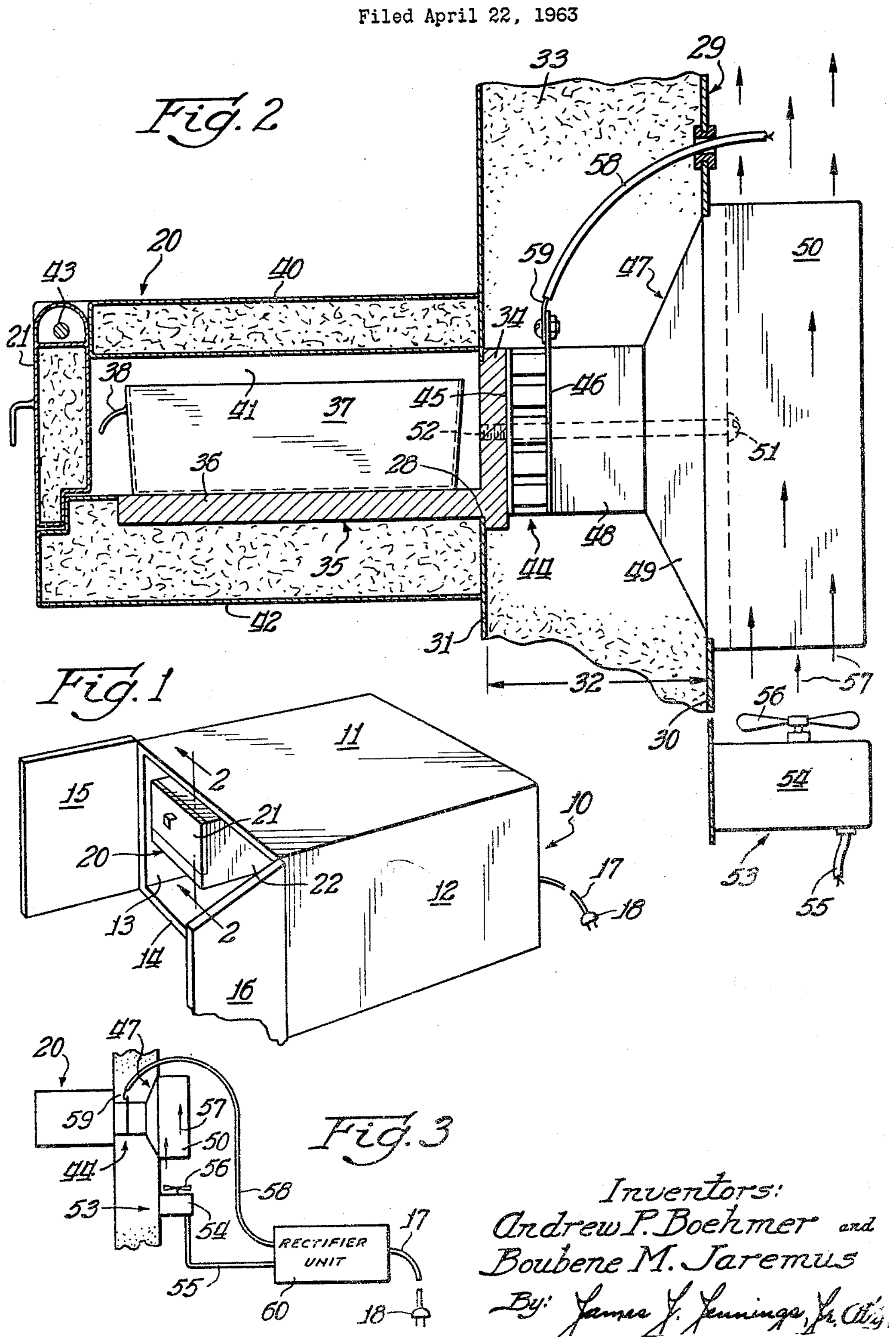
FIGURE 1 is a perspective illustration showing the environment of the invention.
FIGURE 2 is a partial sectional view, taken along the line 2—2 of FIGURE 1, depicting an embodiment of the invention in detail.
FIGURE 3 is an illustrative diagram useful in understanding energization of certain components of the invention.

As shown in FIGURE 1, a thermoelectric cooler or refrigerator 10 is provided of conventional shape, having a top panel or wall 11, a right side wall 12, a left side panel or wall 13, a bottom element 14, left and right pivotally mounted front doors 15 and 16 respectively, and a back wall (not visible in FIGURE 1) to complete the enclosure. Although not evident from the simplified illustration, each of the walls is actually comprised of a pair of spaced apart panels, between which a suitable insulating material, such as Freon-filled polyurethane, is foamed in place both to minimize heat loss from the cooled interior and to enhance the mechanical rigidity of at least certain components within the box. In addition, when a thermoelectric cooling assembly is used, electrical energy is supplied over a cable 17 which terminates in a plug 18 for insertion in the conventional female receptacle of the power mains (not shown).

As viewed from the front, with the doors 15 and 16 opened as illustrated, a freezer compartment 20 is provided in the upper left portion of the cooler 10. The freezer compartment includes a front access door 21 and a right side wall member 22. The construction of freezer compartment 20 will be better understood upon considering the illustration of FIGURE 2.

As there shown, rear wall 29 of the refrigerator is actually comprised of an outer panel 30 spaced from an inner panel or wall portion 31 by a distance referenced by numeral 32, and a suitable insulating material 33 is provided in the space defined between panels 31 and 30. Such insulation, which may be Freon-filled polyurethane or a similar material, is generally foamed in place around the entire box enclosure, and at least in some measure in the doors 15 and 16, to minimize heat loss and assist in providing a mechanically sound unit.

Inner panel 31 is suitably apertured to define an opening 28 for receiving, in a press fit engagement, vertical leg 34 of a combination supporting-and-heat-conducting member 35. Member 35 also comprises a support ledge 36 extending substantially horizontally as illustrated in the drawing, and ledge 36 is oriented at substantially right angles to vertical leg 34. It is noted that the portion of vertical leg 34 to the right in FIGURE 2 is of an area larger than the reduced-area portion which is sized for mating engagement with aperture 28.

In accordance with an important aspect of the invention, horizontal ledge or supporting portion 36 of member 35 provides good mechanical support for maintaining an ice cube tray 37 in the position illustrated. Tray 37 includes a hooklike member 38 of inverted J-shape to facilitate removal of the tray from the freezer compartment. Further in accordance with the invention, member 35 is provided of a good heat conducting material, such as copper, for enhancing removal of heat from the mass on horizontal ledge 36 over vertical leg 34 and a suitable thermoelectric assembly as will be described hereinafter.

In general, freezer compartment 20 includes not only the access door 21, but also a top wall member 40, a left wall 41, bottom wall 42, which has an upper portion molded or otherwise shaped to receive horizontal ledge portion 36 of member 35 and to provide for flush mating engagement with the lower portion of access door 21, and a rod or other journal means 43 extending through corresponding apertures in upper wall 40 and in access door 21 to support the door for clockwise rotation (as viewed in FIGURE 2) about rod 43 to thereby provide the requisite access to the interior of the freezer compartment.

Affixed to the upstanding leg 34 of member 35 is a thermoelectric module assembly 44, which may be any of several such assemblies now commercially available for liberating heat along one surface and absorbing heat along the opposed surface responsive to the passage of unidirectional electrical energy flow therethrough. In the illustrated embodiment, the portion 45 of assembly 44 adjacent leg 34 is the heat-absorbing side, and the other side 46 is the heat-liberating side. Against side 46 is a heat-conducting assembly 47, which is positioned to facilitate the removal of heat from side 46 of the thermoelectric modules. Assembly 47 includes a first portion 48 of substantially uniform cross-section, and a second portion 49 of flared or frusto-conical cross section. Portion 49 extends outwardly and engages a plurality of fin elements 50, only one of which is visible in the drawing. This entire assembly, including elements 35, 44 and 47, is maintained in position by a bolt or other fastening means 51, which extends through assembly 47 and through a suitable central aperture in the thermoelectric assembly 44, and is received in a tapped portion 52 of vertical leg 34.

A fan unit 53 includes a motor 54 for energization over cable 55 to rotate a blade 56, thereby to move air as indicated by arrows 57 upwardly between fins 50 to provide a cooling effect and remove heat from assembly 44 and member 35. If desired, the cooling assembly 53 may be omitted, as a considerable cooling is achieved by the chimney effect of the air rising between the adjacent ones of fins 50.

A pair of input conductors (not shown) can be provided within cable 58 to effect the passage of electrical energy thereover and over connectors 59 to energize modules 44. To simplify energization of the system, motor 54 can be a direct current motor, and a rectifier unit 60 can be utilized as shown in FIGURE 3, so that the inventive system can be used and energized from an A.C. outlet. The system in its simplest construction can thus be stopped and started by inserting electrical wall plug 18 into an A.C. outlet, and by removing the plug. It is manifest that the system is simple and economical to construct and to operate.

To further illustrate the support and mounting problems posed by such a small refrigerator, in one embodiment the dimension 32 between panels 30 and 31 was approximately 1½", so that only a very small space was available to effect the mounting of the thermoelectric assembly and still provide for adequate support of the ice cube tray 37. It is only by the use of the unobvious member 35, which not only provides strong mechanical support for the tray but also defines an excellent heat conduction path from the tray, through member 35 to assembly 44, that a small thermoelectric refrigerator with an adequate and efficient freezer compartment can be provided.

While only a particular embodiment of the invention has been described and illustrated, it is manifest that modifications and alterations may be made therein. It is the intention, therefore, in the appended claims to cover all such modifications and alterations as may fall within the true spirit and scope of the invention.

The embodiments of the invention in which an exclusive property or privilege is claimed are defined as follows:

1. In a refrigerator including a wall having inner and outer panels separated by a predetermined lateral dimension, said inner panel defining an aperture of preassigned extent, a heat-conducting-and-support member including a vertical leg dimensioned to fit within said aperture and including a horizontal ledge extending at substantially right angles to said vertical leg inwardly of said inner panel, said vertical leg further defining an opening for receiving fastening means, a thermoelectric assembly including a central apertured portion and disposed substantially parallel to said panels and flush with said vertical leg of the heat-conducting-and-support member, a heat conducting assembly including a first apertured portion abutting said thermoelectric assembly and extending between said assembly and said outer panel, and a second portion including a plurality of fin elements extending outwardly of said outer panel for dissipating heat to the atmosphere, fastening means extending through said first apertured portion of the heat conducting assembly, through said central apertured portion of the thermoelectric assembly, and into said opening of the vertical leg of the heat-conducting-and-support member, and foamed-in-place insulation disposed between said inner and outer panels and abutting said vertical leg, said thermoelectric assembly and said first portion of the heat conducting assembly to cooperate with said fastening means in providing mechanical support for the components of the refrigerator.

2. For use with a refrigerator having a rear wall portion including inner and outer panels spaced apart from each other, said inner panel defining an aperture of predetermined configuration, the improvement which comprises a combined heat-conducting-and-mechanical supporting member having a horizontal ledge portion for supporting an ice cube tray and a vertical leg portion including a reduced-area segment for snug mating engagement with said aperture, said vertical leg further defining a tapped bore portion centrally thereof, a thermoelectric module assembly having a center opening and disposed substantially parallel said inner and outer panels and abutting said vertical leg portion of the heat-conducting-and-mechanical supporting member, a heat conducting assembly comprising a first apertured portion abutting said thermoelectric assembly, a second apertured and tapered portion abutting said first portion, and a third finned portion abutting said second portion to complete a heat flow path extending from said horizontal ledge portion of the heat-conducting-and-mechanical supporting member over said vertical leg portion, said thermoelectric assembly, and said first, second and third portions of the heat conducting assembly, means including a bolt member for extending through the second and the first portions of the heat conducting assembly, through the center opening of the thermoelectric module assembly, and into the tapped bore portion of the vertical leg of the heat-conducting-and-mechanical supporting member, electrically conductive means extending from said thermoelectric module assembly outwardly of said outer panel for transferring unidirectional electrical energy to said thermoelectric assembly, and foamed-in-place insulation disposed between said inner and outer panels in engagement with said vertical leg portion, said thermoelectric module assembly, the first and second portions of the said heat conducting assembly, and said electrically conductive means, to contribute to the mechanical support of such components.

References Cited by the Examiner

UNITED STATES PATENTS

| | | | |
|---|---|---|---|
| 2,922,284 | 1/60 | Danielson | 62—3 |
| 2,978,875 | 4/61 | Lackey | 62—3 |

WILLIAM J. WYE, *Primary Examiner.*

ROBERT A. O'LEARY, *Examiner.*